United States Patent
Chen et al.

(10) Patent No.: US 9,478,297 B2
(45) Date of Patent: Oct. 25, 2016

(54) MULTIPLE-TIME PROGRAMMABLE MEMORY

(71) Applicant: Taiwan Semiconductor Manufacturing Company Limited, Hsin-Chu (TW)

(72) Inventors: Hsu-Shun Chen, Toufen Town (TW); Cheng-Hsiung Kuo, Jhubei (TW); Gu-Huan Li, Zhubei (TW); Chung-Chieh Chen, New Taipei (TW); Yue-Der Chih, Hsin-Chu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 14/169,763

(22) Filed: Jan. 31, 2014

(65) Prior Publication Data
US 2015/0221383 A1 Aug. 6, 2015

(51) Int. Cl.
*G11C 11/34* (2006.01)
*G11C 16/26* (2006.01)
*G11C 16/04* (2006.01)
*G11C 16/30* (2006.01)

(52) U.S. Cl.
CPC ........... *G11C 16/26* (2013.01); *G11C 16/0433* (2013.01); *G11C 16/0483* (2013.01); *G11C 16/30* (2013.01)

(58) Field of Classification Search
CPC ......... G11C 16/10; G11C 16/34; G11C 7/12; G11C 7/18

USPC ............................................. 365/185.13, 226
See application file for complete search history.

(56) References Cited

U.S. PATENT DOCUMENTS

| | | | |
|---|---|---|---|
| 8,259,507 B2 | 9/2012 | Joo | |
| 2002/0105831 A1* | 8/2002 | Lee et al. | 365/185.21 |
| 2013/0279266 A1* | 10/2013 | Wang | G11C 16/06 365/185.24 |
| 2013/0301358 A1* | 11/2013 | Dunga | G11C 16/24 365/185.19 |

FOREIGN PATENT DOCUMENTS

EP 1023731 B1 9/2006

OTHER PUBLICATIONS

Corresponding Korean application 10-2014-0195556, Korean Office action dated Feb. 3, 2016, 11 pages.

* cited by examiner

*Primary Examiner* — Han Yang
(74) *Attorney, Agent, or Firm* — Cooper Legal Group, LLC

(57) ABSTRACT

A multiple-time programmable (MTP) structure is provided that can operate using a power supply with a supply voltage of 1.5 V to 5.5 V. When the supply voltage is above a first voltage, a first circuit is configured to induce a second constant voltage at a drain of a second transistor, and to induce the second constant voltage on a terminal in a third circuit. In some embodiments, the third circuit provides a third constant voltage on a gate of a third transistor. When the supply voltage is below the first voltage, a fifth circuit is configured to induce a fourth constant voltage on a terminal in the third circuit. The fourth constant voltage is substantially equal to the second constant voltage.

20 Claims, 4 Drawing Sheets

US 9,478,297 B2

MULTIPLE-TIME PROGRAMMABLE MEMORY

BACKGROUND

Multiple-time programmable (MTP) memory technology allows users to write to non-volatile memory more than once. Some MTP memory architectures utilize floating gate transistors as storage elements. An MTP memory cell is configured to store one bit of data. A read operation is performed on the memory cell to read the stored bit of data.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
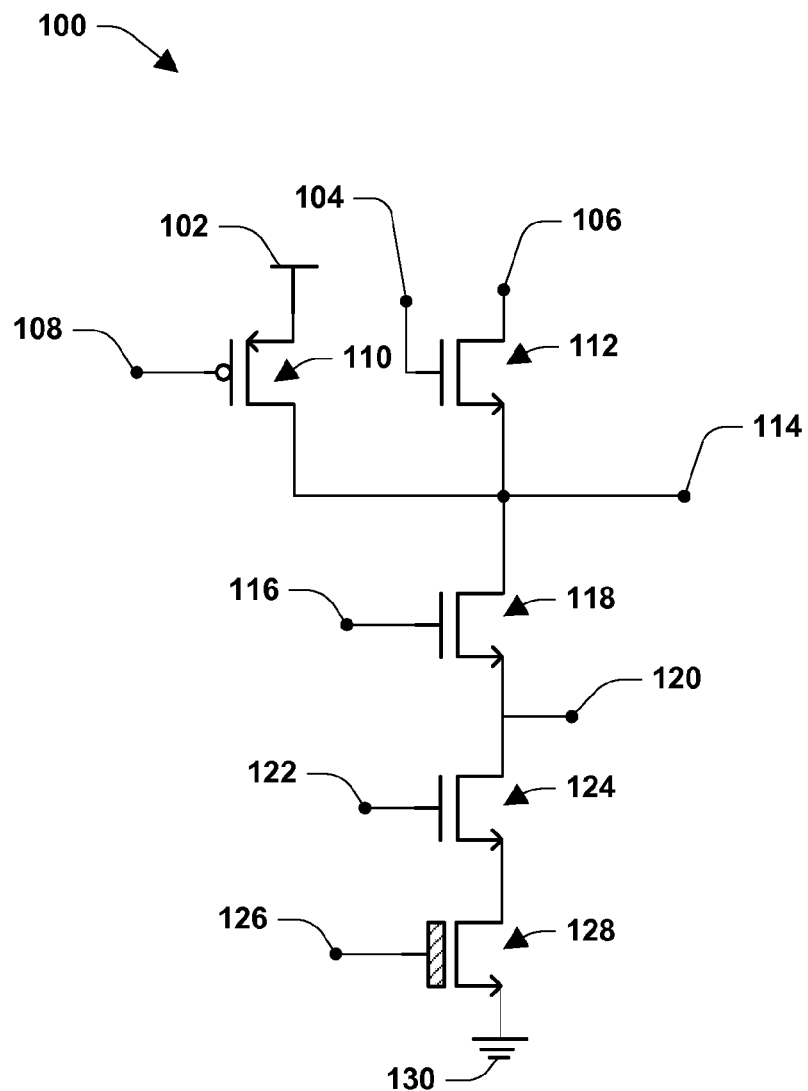
FIG. 1 is an illustration of a circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some embodiments, a memory device is provided. In some embodiments, the memory device comprises a multiple-time programmable (MTP) architecture. In some embodiments, the memory device comprises a first memory cell. In some embodiments, the first memory cell is configured to store a bit of data. In some embodiments, the memory cell is configured to undergo a read operation.

An MTP memory structure 100 is illustrated in FIG. 1. In some embodiments, the MTP memory structure 100 comprises a first transistor 110, a second transistor 112, a third transistor 118, a fourth transistor 124 and a fifth transistor 128. In some embodiments, the first transistor 110 comprises a first P-type metal-oxide-semiconductor (PMOS) transistor. In some embodiments, the second transistor 112 comprises a first N-type metal-oxide-semiconductor (NMOS) transistor. In some embodiments, the third transistor 118 comprises a second NMOS transistor. In some embodiments, the fourth transistor 124 comprises a third NMOS transistor. In some embodiments, the fifth transistor 128 comprises a first floating gate transistor. In some embodiments, the fifth transistor 128 comprises a first floating gate metal-oxide-semiconductor field-effect transistor (MOSFET). In some embodiments, a memory cell comprises the fifth transistor 128. In some embodiments, the memory cell comprises one or more of the first transistor 110, the second transistor 112, the third transistor 118 or the fourth transistor 128. In some embodiments, the memory cell is configured to store a bit of data.

In some embodiments, a source of the first transistor 110 is connected to a first voltage source 102. In some embodiments, the first voltage source 102 is a power supply. In some embodiments, the first voltage source 102 provides a DC voltage. In some embodiments, the first voltage source 102 provides a voltage greater than 10 V. In some embodiments, the first voltage source 102 provides a voltage less than 10 V. In some embodiments, the first voltage source 102 provides a voltage that is less than 5.5 V and greater than 1.5 V. In some embodiments, the first voltage source 102 provides a voltage substantially equal to 5 V. In some embodiments, the first voltage source 102 provides a voltage substantially equal to 3 V. In some embodiments, a gate of the first transistor 110 is configured to receive a first signal at a first node 108. In some embodiments, the first signal is a control signal. In some embodiments, the first signal is a reference current signal. In some embodiments, a gate of the second transistor is configured to receive a second signal at a second node 104. In some embodiments, the second signal is a control signal. In some embodiments, the second signal is a pre-charge signal. In some embodiments, a drain of the second transistor is configured to receive a third signal at a third node 106. In some embodiments, the third signal is a first biasing signal. In some embodiments, a source of the second transistor 112 is connected to a drain of the first transistor 110. In some embodiments, the drain of the first transistor is connected to a fourth node 114. In some embodiments, a fourth signal resides at the fourth node 114. In some embodiments, the fourth signal is a digital-output signal. In some embodiments, the fourth node 114 is connected to a drain of the third transistor 118. In some embodiments, a gate of the third transistor 118 is configured to receive a fifth signal at a fifth node 116. In some embodiments, the fifth signal is a second biasing signal. In some embodiments, a source of the third transistor 118 is connected to a node 120 which is connected to a bit line. In some embodiments, the node 120 is connected to a drain of the fourth transistor 124. In some embodiments, a gate of the fourth transistor 124 is configured to receive a sixth signal at a sixth node 122. In some embodiments, the sixth signal is connected to a multiplexer. In some embodiments, the sixth signal is a control signal. In some embodiments, the sixth signal is a YMUX signal. In some embodiments, a source of the fourth transistor 124 is connected to a drain of the fifth transistor 128. In some embodiments, a gate of the fifth transistor 128 is connected to a seventh node 126, which is connected to a word line. In some embodiments, a source of the fifth transistor 128 is connected to a second voltage source 130.

In some embodiments, the memory cell undergoes a write operation configured to set the fifth transistor 128 to a first state. In some embodiments, the memory cell undergoes a write operation configured to set the fifth transistor 128 to a second state. In some embodiments, when the fifth transistor 128 is in the first state, and a read operation is performed on the memory cell, a device performing the read operation will read a bit of data equal to 1. In some embodiments, when the fifth transistor 128 is in the second state, and a read operation is performed a device performing the read operation will read a bit of data equal to 0. In some embodiments, the first state is a bit-1 state. In some embodiments, the second state is a bit-0 state. In some embodiments, a first current passes through the fifth transistor 128 to the second voltage source 130. In some embodiments, a magnitude of the first current when the fifth transistor 128 is in the bit-1 state is not equal to the magnitude of the first current when the fifth transistor 128 is in the bit-0 state. In some embodiments, when the fifth transistor 128 is in the bit-1 state, the magnitude of the first current is between 30 μA and 70 μA. In some embodiments, when the fifth transistor 128 is in the bit-1 state, the magnitude of the first current is between 45 μA and 55 μA. In some embodiments, when the fifth transistor 128 is in the bit-1 state, the magnitude of the first current is substantially equal to 50 μA. In some embodiments, when the fifth transistor 128 is in the bit-0 state, the magnitude of the first current is between 0 μA and 20 μA. In some embodiments, when the fifth transistor 128 is in the bit-0 state, the magnitude of the first current is between 5 μA and 15 μA. In some embodiments, when the fifth transistor 128 is in the bit-0 state, the magnitude of the first current is substantially equal to 10 μA.

In some embodiments, the first transistor 110 is configured to provide a second current to the drain of the first transistor 110. In some embodiments, a voltage of the current reference signal is applied to the gate of the first transistor 110. In some embodiments, the voltage of the current reference signal is less than 5 V. In some embodiments, the voltage of the current reference signal is greater than 0.8 V and less than 1 V. In some embodiments, the current reference signal stays a constant voltage. In some embodiments, the second current is a reference current. In some embodiments, the reference current is constant. In some embodiments, a magnitude of the reference current is between 0 μA and 50 μA. In some embodiments, a magnitude of the reference current is between 20 μA and 30 μA. In some embodiments, a magnitude of the reference current is substantially equal to 25 μA.

In some embodiments, when the second transistor 112 is activated, the second transistor 112 is configured to induce a first bias voltage of the first biasing signal on the drain of the second transistor 112. In some embodiments, when the second transistor 112 is deactivated, the second transistor is configured to maintain a disconnection between the first biasing signal at the third node 106 and the source of the second transistor 112. In some embodiments, the second transistor 112 is activated when a voltage of the pre-charge signal is within a high voltage state voltage range. In some embodiments, the high voltage state voltage range comprises voltages greater than 3 V and less than 5 V. In some embodiments, the second transistor 112 is deactivated when a voltage of the pre-charge signal is within a low voltage state voltage range. In some embodiments, the low voltage state voltage range comprises voltages greater than 0 V and less than 1 V. In some embodiments, the second transistor 112 is deactivated when a voltage of the pre-charge signal is substantially equal to 0 V.

In some embodiments, the first bias voltage is substantially equal to 3 V. In some embodiments, the first bias voltage is substantially equal to 5 V. In some embodiments, the first bias voltage is less than 5 V. In some embodiments, the first bias voltage is greater than 2.5 V and less than 3.5 V. In some embodiments, a power of the MTP memory structure 100 is a function of the first bias voltage. In some embodiments, the power of the MTP memory structure 100 increases when the first bias voltage increases. In some embodiments, it is desired to limit the power of the MTP memory structure 100, in order to limit energy. In some embodiments, it is desired to limit the first bias voltage. In some embodiments, controlling the first bias voltage reduces a crowbar current that occurs during a read operation.

In some embodiments, the third transistor 118 is configured to maintain a disconnection between the drain of the third transistor 118 and the source of the third transistor 118, when the third transistor 118 is deactivated. In some embodiments, the third transistor 118 is deactivated when a voltage of the second biasing signal is substantially equal to 0 V. In some embodiments, the third transistor 118 is configured to allow some current to flow from the drain of the third transistor 118 to the source of the third transistor 118, when the voltage of the second biasing signal is substantially equal to a second bias voltage. In some embodiments, a current flowing to the source of the third transistor 118 is a function of the second bias voltage. In some embodiments, when the second bias voltage increases, the current flowing to the source of the third transistor 118 increases. In some embodiments, the power of the MTP memory structure is a function of the second bias voltage. In some embodiments, the power of the MTP memory structure 100 increases when the second bias voltage increases. In some embodiments, it is desired to limit the power of the MTP memory structure 100. In some embodiments, it is desired to limit the second bias voltage. In some embodiments, the second bias voltage is substantially equal to 5 V. In some embodiments, the second bias voltage is greater than 2 V and less than 3 V. In some embodiments, the second bias voltage is substantially equal to 2.3 V.

In some embodiments, the fourth transistor 124 is configured to maintain a disconnection between the drain of the fourth transistor 124 and the source of the fourth transistor 124, when the fourth transistor 124 is deactivated. In some embodiments, the fourth transistor 124 is configured to connect the drain of the fourth transistor 124 to the source of the fourth transistor 124, when the fourth transistor 124 is activated. In some embodiments, the fourth transistor 124 is activated when a voltage of the YMUX signal is greater than 2 V and less than 5 V. In some embodiments, the fourth transistor 124 is activated when a voltage of the YMUX signal is substantially equal to 5 V. In some embodiments, a current passing through the fourth transistor 124 to the source of the fourth transistor 124 is a function of the voltage of the YMUX signal. In some embodiments, when the voltage of the YMUX signal increases, the current passing through the fourth transistor 124 to the source of the fourth transistor 124 increases. In some embodiments, a read margin of a read operation performed on the memory cell is a function of the voltage of the YMUX signal. In some embodiments, when the voltage of the YMUX signal increases, the read margin of the read operation performed on the memory cell increases. In some embodiments, the first voltage source 102 provides a voltage that is less than 2 V. In some embodiments, when the first voltage source 102 provides a voltage that is less than 2 V, the voltage of the YMUX signal is less than 2 V. In some embodiments, the read margin is lower than a desired read margin, when the YMUX signal is less than 2 V. In some embodiments, a YMUX boost circuit is connected to the sixth node 122. In some embodiments, the YMUX boost circuit is configured to provide a voltage to the sixth node 122 when the voltage of the YMUX signal is between 1.5 V and 3.5 V such that the read margin is at a desired level.

In some embodiments, the fifth transistor 128 is configured to maintain a disconnection between the drain of the fifth transistor 128 and the source of the fifth transistor 128, when the fifth transistor 128 is deactivated. In some embodiments, the fifth transistor 128 is configured to allow some current to flow through the fifth transistor 128 to the source of the fifth transistor 128, when the fifth transistor 128 is activated. In some embodiments, the fifth transistor 128 is activated when a voltage at the word line is greater than 2 V and less than 5 V. In some embodiments, the fifth transistor 128 is activated when a voltage at the word line is substantially equal to 5 V. In some embodiments, when the fifth transistor 128 is in the bit-1 state, a current passing through the fifth transistor 128 to the source of the fifth transistor 128 is greater than 45 µA and less than 55 µA. In some embodiments, when the fifth transistor 128 is in the bit-0 state, a current passing through the fifth transistor 128 to the source of the fifth transistor 128 is greater than 5 µA and less than 10 µA. In some embodiments, a current passing through the fifth transistor 128 to the source of the fifth transistor 128 is a function of the voltage at the word line. In some embodiments, when the voltage at the word line increases, the current passing through the fifth transistor 128 to the source of the fifth transistor 128 increases. In some embodiments, a read margin of a read operation performed on the memory cell is a function of the current passing through the fifth transistor 128 to the source of the fifth transistor 128. In some embodiments, when the voltage at the word line increases, the read margin of the read operation performed on the memory cell increases. In some embodiments, the first voltage source 102 provides a voltage that is less than 2 V. In some embodiments, when the first voltage source 102 provides a voltage that is less than 2 V, the voltage of the word line is less than 2 V. In some embodiments, the read margin is lower than a desired read margin, when the word line is less than 2 V. In some embodiments, a word line boost circuit is connected to the word line. In some embodiments, the word line boost circuit is configured to provide a voltage to the word line when the voltage at the word line is between 1.5 V and 3.5 V such that the read margin is at a desired level.

In some embodiments, the MTP memory structure 100 is connected to the word line boost circuit, and the MTP memory structure 100 is not connected to the YMUX boost circuit. In some embodiments, the MTP memory structure 100 is connected to the YMUX boost circuit, and the MTP memory structure 100 is not connected to the word line boost circuit. In some embodiments, when the MTP memory structure 100 is connected to the word line boost circuit and is not connected to the YMUX boost circuit, the read margin is substantially equal to a first read margin. In some embodiments, when the MTP memory structure 100 is connected to the YMUX boost circuit and is not connected to the word line boost circuit, the read margin is substantially equal to a second read margin. In some embodiments, the second read margin is higher than the first read margin.

Figure 2:
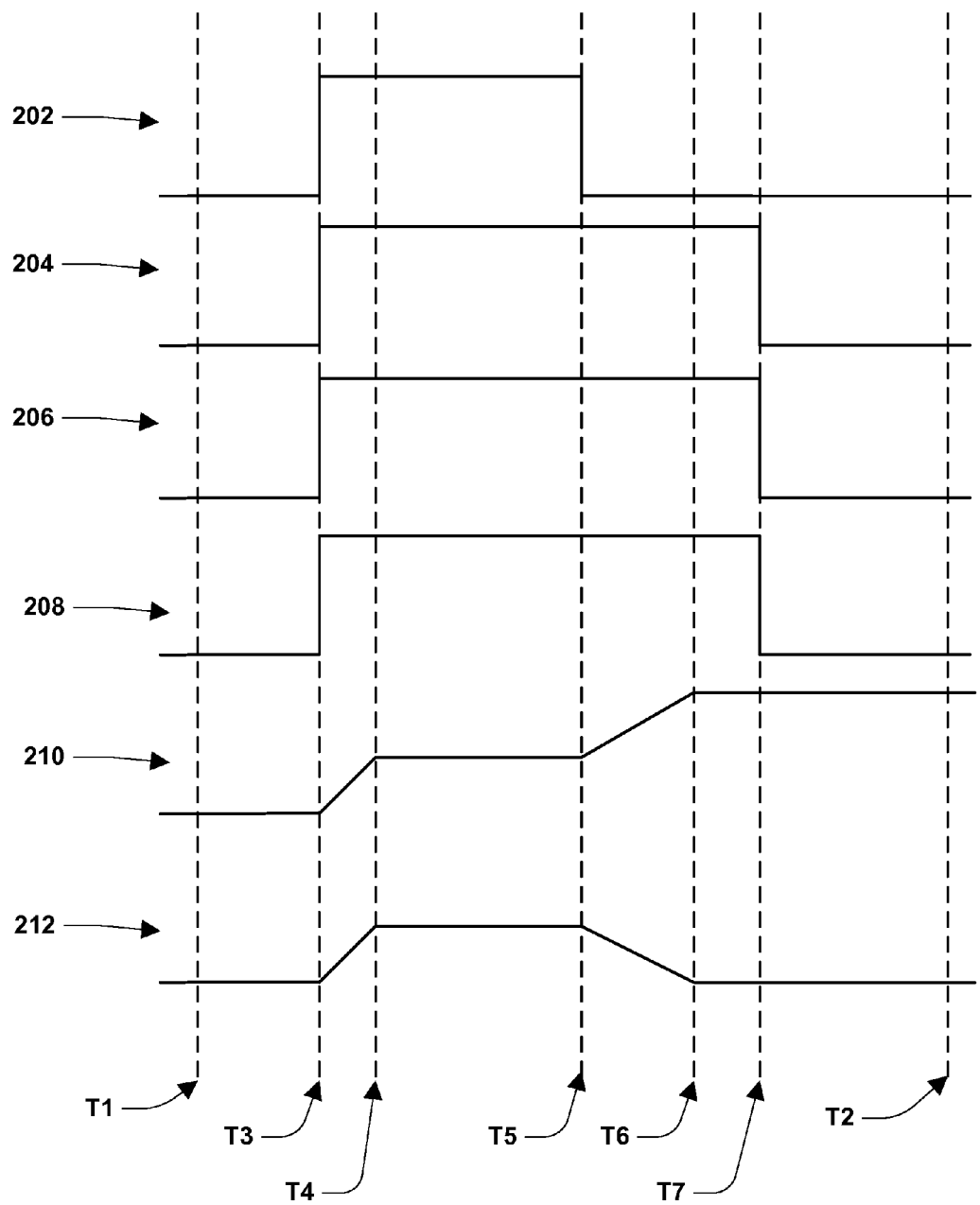
FIG. 2 is an illustration of waveforms, in accordance with some embodiments.

FIG. 2 illustrates waveforms of various signals connected to the MTP memory structure 100. In some embodiments, a waveform 202 illustrates values of a voltage of the pre-charge signal from a first point in time T1 to a second point in time T2. In some embodiments, a waveform 204 illustrates values of a voltage of the second biasing signal from the first point in time T1 to the second point in time T2. In some embodiments, a waveform 206 illustrates values of a voltage of the YMUX signal from the first point in time T1 to the second point in time T2. In some embodiments, a waveform 208 illustrates values of a voltage at the word line, from the first point in time T1 to the second point in time T2. In some embodiments, a waveform 210 illustrates values of a voltage of the digital output signal when the fifth transistor 128 is in the bit-0 state. In some embodiments, a waveform 212 illustrates values of a voltage of the digital output signal when the fifth transistor 128 is in the bit-1 state. In some embodiments, the first point in time T1 occurs before a read operation of the memory cell. In some embodiments, the second point in time T2 occurs after the read operation of the memory cell.

FIG. 2 illustrates that, in some embodiments, at the first point in time T1, a voltage of the pre-charge signal, a voltage of the second biasing signal, a voltage of the YMUX signal, a voltage at the word line, and a voltage of the digital output signal are respectively substantially equal to 0 V. The waveform 202 illustrates that, in some embodiments, at a third point in time T3, the voltage of the pre-charge signal changes from 0 V to a first voltage. In some embodiments, the first voltage is greater than 3 V and less than 5 V. In some embodiments, the first voltage is substantially equal to a voltage of the first voltage source. The waveform 204 illustrates that, in some embodiments, at the third point in time T3, the voltage of the second biasing signal changes from 0 V to a second bias voltage. In some embodiments, the second bias voltage is substantially equal to 2.2 V. The waveform 206 illustrates that, in some embodiments, at the third point in time T3, the YMUX signal changes from 0 V to a third voltage. In some embodiments, the third voltage is greater than 3 V and less than 5 V. In some embodiments, the third voltage is substantially equal to 5 V. The waveform 208 illustrates that, in some embodiments, at the third point in time T3, the voltage at the word line changes from 0 V to a fourth voltage. In some embodiments, the fourth voltage is greater than 1 V and less than 5 V. The waveform 210 illustrates that, in some embodiments, at the third point in time T3, the voltage of the digital output signal starts to increase to a fifth voltage, when the fifth transistor 128 is in the bit-0 state. The waveform 210 illustrates that, in some embodiments, the voltage of the digital output signal reaches the fifth voltage and stops increasing at a fourth point in time T4, when the fifth transistor 128 is in the bit-0 state. The waveform 212 illustrates that, in some embodiments, at the third point in time T3, the voltage of the digital output signal starts to increase to the fifth voltage, when the fifth transistor 128 is in the bit-1 state. The waveform 212 illustrates that, in some embodiments, the voltage of the digital output signal reaches the fifth voltage and stops increasing at a fourth point in time T4. In some embodiments, the fifth voltage is substantially equal to a voltage of the first biasing signal. In some embodiments, the voltage of the first biasing signal is constant from the first point in time T1 to the second point in time T2. In some embodiments, the voltage of the first biasing signal is substantially equal to 3 V.

The waveform 202 illustrates that, in some embodiments, the voltage of the pre-charge signal changes from the first voltage to 0 V, at a fifth point in time T5. In some embodiments, the second transistor 112 becomes deactivated at the fifth point in time T5. The waveform 210 illustrates that, at the fifth point in time T5, in some embodiments, the voltage of the digital output signal starts to increase to a sixth voltage, if the fifth transistor is in a bit-0 state. In some embodiments, the digital output signal reaches the sixth voltage at a sixth point in time T6. In some embodiments, at the fifth point in time T5, if the fifth transistor 128 is in the bit-1 state, current will flow from the digital output signal to the second voltage source 130. The waveform 212 illustrates that, in some embodiments, at the fifth point in time T5, the voltage of the digital output signal starts to decrease to 0 V. In some embodiments, the voltage of the digital output signal reaches 0 V at the sixth point in time T6. The waveform 204 illustrates that, in some embodiments, at a seventh point in time T7, the voltage of the second biasing signal changes from the second bias voltage to 0 V. The waveform 206 illustrates that, in some embodiments, at the seventh point in time T7, the voltage of the YMUX signal changes from the third voltage to 0 V. The waveform 208 illustrates that, in some embodiments, at the seventh point in time T7, the voltage at the word line decreases from the fourth voltage to 0 V.

Figure 3:
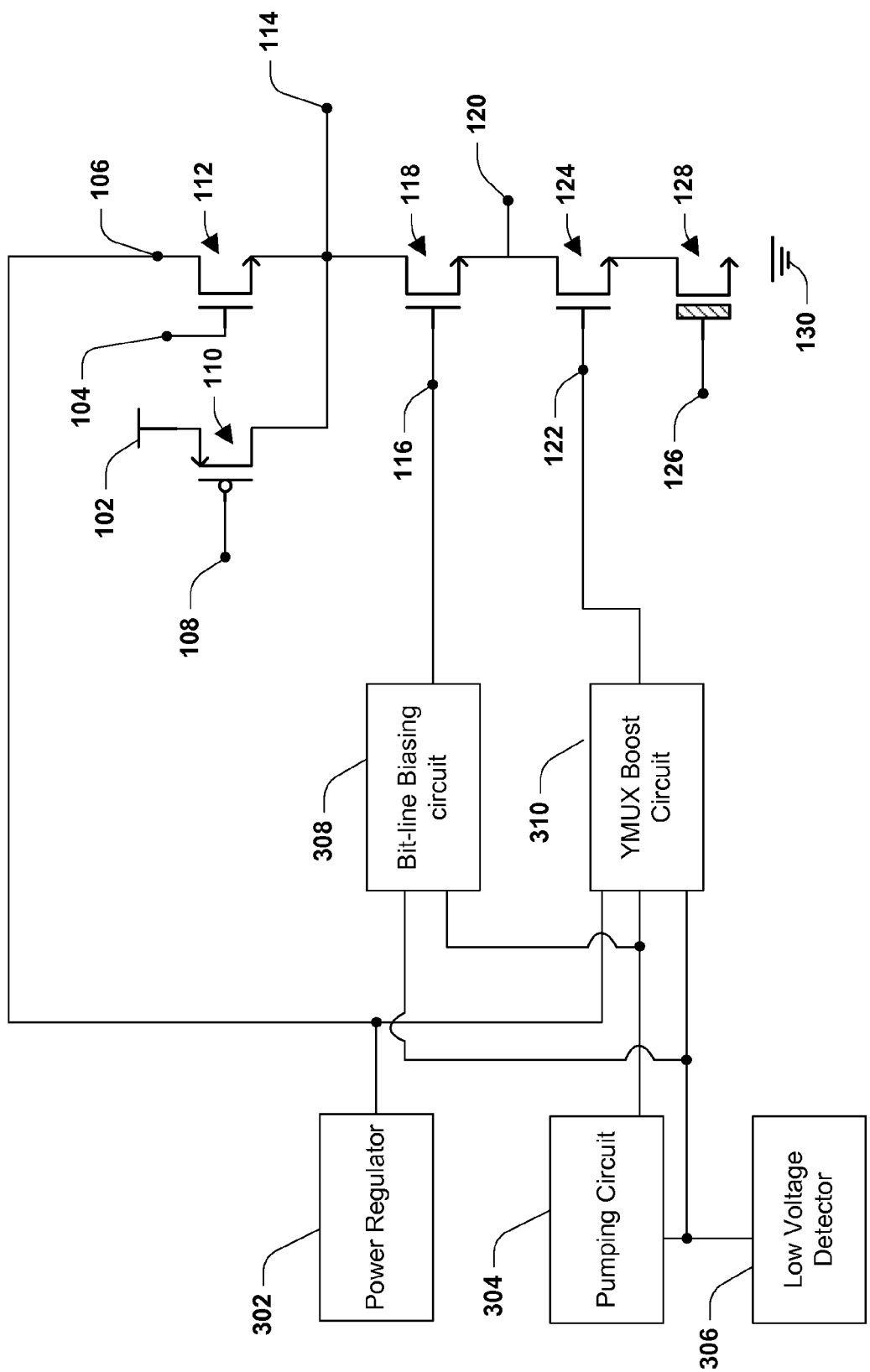
FIG. 3 illustrates a hardware block diagram, in accordance with some embodiments.

FIG. 3 illustrates a first circuit 302, a second circuit 310, a third circuit 308, a fourth circuit 306, a fifth circuit 304, a first transistor 110, a second transistor 112, a third transistor 118, a fourth transistor 124 and a fifth transistor 128. In some embodiments, the first transistor 110 comprises a first PMOS transistor. In some embodiments, the second transistor 112 comprises a first NMOS transistor. In some embodiments, the third transistor 118 comprises a second NMOS transistor. In some embodiments, the fourth transistor 124 comprises a third NMOS transistor. In some embodiments, the fifth transistor 128 comprises a first floating-gate transistor. In some embodiments, a memory cell comprises the fifth transistor 128. In some embodiments, the memory cell comprises one or more of the first transistor 110, the second transistor 112, the third transistor 118 or the fourth transistor 128. In some embodiments, the memory cell is configured to store a bit of data.

In some embodiments, a source of the first transistor 110 is connected to a first voltage source 102. In some embodiments, the first voltage source 102 is a power supply. In some embodiments, the first voltage source 102 provides a DC voltage. In some embodiments, the first voltage source 102 provides a voltage greater than 10 V. In some embodiments, the first voltage source 102 provides a voltage less than 10 V. In some embodiments, the first voltage source 102 provides a voltage that is less than 5.5 V and greater than 1.5 V. In some embodiments, the first voltage source 102 provides a voltage substantially equal to 5 V. In some embodiments, the first voltage source 102 provides a voltage substantially equal to 3 V. In some embodiments, a gate of the first transistor 110 is configured to receive a first signal at a first node 108. In some embodiments, the first signal is a control signal. In some embodiments, the first signal is a reference current signal. In some embodiments, a gate of the second transistor is configured to receive a second signal at a second node 104. In some embodiments, the second signal is a control signal. In some embodiments, the second signal is a pre-charge signal. In some embodiments, a drain of the second transistor is configured to receive a third signal at a third node 106. In some embodiments, the third signal is a first biasing signal. In some embodiments, a source of the second transistor 112 is connected to a drain of the first transistor 110. In some embodiments, the drain of the first transistor is connected to a fourth node 114. In some embodiments, a fourth signal resides at the fourth node 114. In some embodiments, the fourth signal is a digital-output signal. In some embodiments, the fourth node 114 is connected to a drain of the third transistor 118. In some embodiments, a gate of the third transistor 118 is configured to receive a fifth signal at a fifth node 116. In some embodiments, the fifth signal is a second biasing signal. In some embodiments, a source of the third transistor 118 is connected to a node 120 which is connected to a bit line. In some embodiments, the node 120 is connected to a drain of the fourth transistor 124. In some embodiments, a gate of the fourth transistor 124 is configured to receive a sixth signal at a sixth node 122. In some embodiments, the sixth signal is connected to a multiplexer. In some embodiments, the sixth signal is a control signal. In some embodiments, the sixth signal is a YMUX signal. In some embodiments, a source of the fourth transistor 124 is connected to a drain of the fifth transistor 128. In some embodiments, a gate of the fifth transistor 128 is connected to a seventh node 126, which is connected to a word line. In some embodiments, a source of the fifth transistor 128 is connected to a second voltage source 130.

In some embodiments, the first circuit 302 is a power regulator circuit. In some embodiments, the second circuit 310 is a YMUX boost circuit. In some embodiments, the third circuit 308 is a bit line biasing circuit. In some embodiments, the fourth circuit 306 is a low voltage detector. In some embodiments, the fifth circuit 304 is a pumping circuit. In some embodiments, the first circuit 302 is connected to the first biasing signal at the third node 106. In some embodiments, the first circuit 302 is connected to the second circuit 310. In some embodiments, the second circuit 310 is connected to the first biasing signal at the third node 106. In some embodiments, the second circuit 310 is connected the third circuit 308. In some embodiments, the second circuit 310 is connected to the fifth circuit 304. In some embodiments, the second circuit 310 is connected to the fourth circuit 306. In some embodiments, the fourth circuit 306 is connected to the fifth circuit 304. In some embodiments, the third circuit 308 is connected to the second biasing signal at the fifth node 116. In some embodiments, the second circuit 310 is connected to the YMUX signal at the sixth node 122.

In some embodiments, the first circuit 302 is configured to output a constant first specified voltage, when the voltage of the first voltage source 102 is above a second specified voltage. In some embodiments, the constant first specified voltage is substantially equal to 3 V. In some embodiments, the second specified voltage is substantially equal to 3 V. In some embodiments, the first circuit 302 is configured to control the voltage of the first biasing signal. In some embodiments, when the voltage of the first voltage source 102 is above the second specified voltage, the first circuit 302 induces the constant first specified voltage on the first biasing signal at the third node 106. In some embodiments, the first circuit 302 is configured to induce the constant first specified voltage on a terminal within the second circuit 310. In some embodiments, the second circuit 310 is configured to use the constant first specified voltage as a power source to induce a constant voltage at the sixth node 122 during a read operation, when the voltage of the first voltage source is greater than the second specified voltage, such that the YMUX signal has a voltage substantially equal to the constant voltage.

In some embodiments, the fourth circuit 306 is configured to activate the fifth circuit 304 when the voltage of the first voltage source 102 is lower than a third specified voltage. In some embodiments, the third specified voltage is substantially equal to the second specified voltage. In some embodiments, the third specified voltage is substantially equal to 3 V. In some embodiments, the fifth circuit 304 is configured to provide a constant fourth specified voltage to the MTP memory structure 100 that is higher than the voltage of the first voltage source 102, when the voltage of the first voltage source 102 is lower than the third specified voltage. In some embodiments, the constant fourth specified voltage is substantially equal to 3 V. In some embodiments, the third circuit 308 is configured to receive the constant fourth specified voltage, and use it to induce a constant voltage on the second biasing signal at the fifth node 116, when the voltage of the first voltage source 102 is lower than the third specified voltage. In some embodiments, the second circuit 310 is configured to receive the constant fourth specified voltage, and use it to induce a constant voltage the sixth node 122, when the voltage of the first voltage source 102 is lower than the third specified voltage such that the YMUX signal has a voltage substantially equal to the constant voltage.

Figure 4:
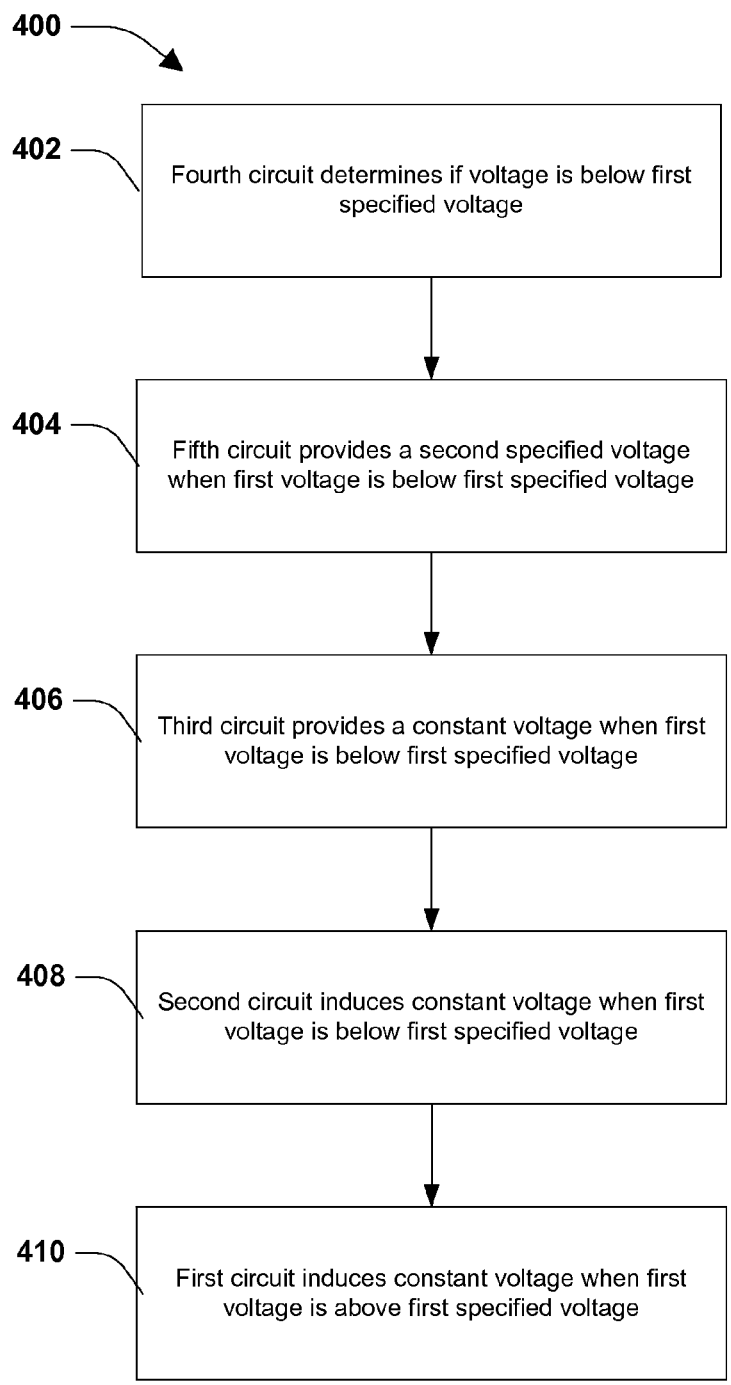
FIG. 4 illustrates a flow diagram of a method for controlling a voltage at a node of a read-only memory cell, in accordance with some embodiments.

FIG. 4 illustrates a method of operating an MTP memory structure. In some embodiments, at 402, the fourth circuit 306 determines if the first voltage source 102 has a voltage that is below a specified voltage. In some embodiments, at 404, the fifth circuit 304 provides another specified voltage when the voltage of the first voltage source 102 is below the specified voltage. In some embodiments, at 406, the third circuit 308 induces a constant voltage at the fifth node 116 such that the second biasing signal has a voltage that is substantially equal to the constant voltage, when the voltage of the first voltage source 102 is below the specified voltage. In some embodiments, at 408, the second circuit 310 induces a constant voltage at the sixth node 122, such that the YMUX signal has a voltage that is substantially equal to the constant voltage. In some embodiments, at 410, the first circuit 302 induces a constant first specified voltage at the third node 106, when the first voltage source such that the first biasing signal has a voltage that is substantially equal to the constant first specified voltage, when the voltage of the first voltage source 102 is above the specified voltage.

According to some embodiments, an MTP memory structure is provided, comprising a second transistor and a fourth transistor. The second transistor is operable coupled to a bit line and a drain of the fourth transistor is coupled to the bit line. The MTP memory structure also comprises a first circuit configured to induce a first constant voltage at a drain of the second transistor. The MTP memory structure also comprises a second circuit configured to induce a second constant voltage at a gate of the fourth transistor.

According to some embodiments, a CMOS MTP memory structure is provided. The CMOS MTP memory structure comprises a second transistor, a third transistor and a fourth transistor. The CMOS MTP memory structure comprises a first circuit configured to induce a first constant voltage at a drain of the second transistor. The CMOS MTP memory structure comprises a second circuit configured to induce a second constant voltage at a gate of the fourth transistor. The CMOS MTP memory structure comprises a third circuit configured to induce a third constant voltage at a gate of the third transistor.

According to some embodiments, a method of operating an MTP memory structure is provided. The method comprises using a fourth circuit to determine if a first voltage in the MTP memory structure is below a first specified voltage. The method comprises using a fifth circuit to provide a second specified voltage to the MTP memory structure when the first voltage is below the first specified voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. Also, it will be understood that not all operations are necessary in some embodiments.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A multiple-time programmable (MTP) memory structure, comprising:
    a first transistor;

a second transistor comprising a first source/drain region directly coupled to a first source/drain region of the first transistor at a node;
a third transistor operably coupled between the node and a bit line;
a fourth transistor operably coupled between the bit line and a voltage source and operably coupled between the third transistor and the voltage source;
a first circuit configured to induce a first constant voltage at a second source/drain region of the first transistor; and
a second circuit configured to induce a second constant voltage at a gate of the fourth transistor.

2. The MTP memory structure of claim 1, comprising a fifth transistor operably coupled between the fourth transistor and the voltage source.

3. The MTP memory structure of claim 1, the third transistor comprising a P-type metal-oxide-semiconductor (PMOS) transistor.

4. The MTP memory structure of claim 1, the first transistor comprising an N-type metal-oxide-semiconductor (NMOS) transistor.

5. The MTP memory structure of claim 1, the fourth transistor comprising an NMOS transistor.

6. The MTP memory structure of claim 1, the second transistor comprising an NMOS transistor.

7. The MTP memory structure of claim 2, the fifth transistor comprising a floating gate metal-oxide-semiconductor field-effect transistor (MOSFET).

8. The MTP memory structure of claim 1, the gate of the fourth transistor connected to a control signal.

9. The MTP memory structure of claim 2, a gate of the fifth transistor connected to a word line.

10. The MTP memory structure of claim 1, a first source/drain of the third transistor directly coupled to the first source/drain region of the first transistor at the node.

11. A CMOS multiple-time programmable (MTP) memory structure, comprising:
a first transistor, a second transistor and a third transistor;
a first circuit configured to induce a first constant voltage at a drain of the first transistor;
a second circuit configured to induce a second constant voltage at a gate of the second transistor;
a third circuit configured to induce a third constant voltage at a gate of the third transistor;
a first voltage source; and
a fourth circuit configured to induce a fourth voltage on the third circuit when a voltage provided by the first voltage source is below a first specified voltage.

12. The CMOS MTP memory structure of claim 11, a voltage provided by the first voltage source substantially equal to 1.5 volts.

13. The CMOS MTP memory structure of claim 11, comprising a floating gate transistor, a source of the floating gate transistor connected to a second voltage source.

14. A multiple-time programmable (MTP) memory structure, comprising:
a first transistor comprising a first source/drain region coupled to a voltage source and a second source/drain region coupled to an output terminal;
a second transistor comprising a first source/drain region coupled to a power regulator circuit and a second source/drain region coupled to the output terminal;
a third transistor comprising a first source/drain region coupled to the output terminal and a second source/drain region coupled to a bitline;
a fourth transistor comprising a first source/drain region coupled to the bitline; and
a fifth transistor comprising a first source/drain region coupled to a second source/drain region of the fourth transistor and a second source/drain region coupled to a second voltage source, wherein:
the first source/drain region of the fourth transistor is coupled to the bitline via a first coupling;
the first source/drain region of the fifth transistor is coupled to the second source/drain region of the fourth transistor via a second coupling;
the first coupling does not comprise the second source/drain region of the fourth transistor; and
the second coupling does not comprise the first source/drain region of the fourth transistor.

15. The MTP memory structure of claim 14, wherein the first transistor is a first-type transistor and the second transistor is a second-type transistor different than the first-type transistor.

16. The MTP memory structure of claim 14, wherein the first transistor is a P-type metal-oxide-semiconductor (PMOS) transistor and the second transistor is an N-type metal-oxide-semiconductor (NMOS) transistor.

17. The MTP memory structure of claim 14, wherein a gate of the fifth transistor is coupled to a wordline.

18. The MTP memory structure of claim 14, wherein the fifth transistor comprises a floating gate metal-oxide-semiconductor field-effect transistor (MOSFET).

19. The MTP memory structure of claim 1, a first source/drain of the third transistor directly coupled to the first source/drain region of the first transistor at the node and a second source/drain of the third transistor directly coupled to the bit line.

20. The MTP memory structure of claim 19, a first source/drain region of the fourth transistor directly coupled to the bit line.

* * * * *